US010473695B2

(12) United States Patent
Kameko et al.

(10) Patent No.: US 10,473,695 B2
(45) Date of Patent: Nov. 12, 2019

(54) CURRENT DETECTION DEVICE

(71) Applicant: KOA CORPORATION, Ina-shi, Nagano (JP)

(72) Inventors: Kenji Kameko, Ina (JP); Junpei Yamamoto, Ina (JP); Keishi Nakamura, Ina (JP)

(73) Assignee: KOA CORPORATION, Ina-shi (JP)

( * ) Notice: Subject to any disclaimer, the term of this patent is extended or adjusted under 35 U.S.C. 154(b) by 71 days.

(21) Appl. No.: 15/572,938

(22) PCT Filed: May 13, 2016

(86) PCT No.: PCT/JP2016/064256
§ 371 (c)(1),
(2) Date: Nov. 9, 2017

(87) PCT Pub. No.: WO2016/186022
PCT Pub. Date: Nov. 24, 2016

(65) Prior Publication Data
US 2018/0156844 A1 Jun. 7, 2018

(30) Foreign Application Priority Data

May 19, 2015 (JP) ................. 2015-101880

(51) Int. Cl.
*G01R 15/14* (2006.01)
*G01R 1/20* (2006.01)
(Continued)

(52) U.S. Cl.
CPC ........... *G01R 15/146* (2013.01); *G01R 1/203* (2013.01); *G01R 19/0092* (2013.01);
(Continued)

(58) Field of Classification Search
CPC . G01R 1/00; G01R 1/20; G01R 1/203; G01R 15/00; G01R 15/14; G01R 15/146;
(Continued)

(56) References Cited

U.S. PATENT DOCUMENTS

| 906,498 A | 12/1908 | Weston | |
| 2007/0176626 A1* | 8/2007 | Bayerer | ................... G01K 7/30 |
| | | | 702/99 |

(Continued)

FOREIGN PATENT DOCUMENTS

| CN | 1545106 A | 11/2004 |
| JP | 2008-39571 A | 2/2008 |

(Continued)

OTHER PUBLICATIONS

International Search Report dated Jul. 19, 2016, issued in counterpart International Application No. PCT/JP2016/064256 (2 pages).

*Primary Examiner* — Hoai-An D. Nguyen
(74) *Attorney, Agent, or Firm* — Westerman, Hattori, Daniels & Adrian, LLP

(57) ABSTRACT

Provided is a current detection device in which, to a bus bar type shunt resistor, another member can be easily connected and fixed by means of rotational fastening of screw members. The current detection device is provided with: a pair of wiring members (11, 12) consisting of electrically conductive metal material; a resistor body (13) consisting of metal material having a smaller temperature coefficient of resistance than the wiring members and which is bonded to the wiring members; and a screw member (16) which is fixed to at least one of the wiring members and which is a separate member from the wiring members. One screw member (16) is fixed to one surface of the wiring members (11, 12), and another screw member (17) is rotationally fastened to the one screw member (16) sandwiching another member (18, (Continued)

19) disposed on the other surface of the wiring members (11,12).

7 Claims, 7 Drawing Sheets

(51) Int. Cl.
  G01R 19/32 (2006.01)
  G01R 19/00 (2006.01)
  H01C 7/06 (2006.01)
  H01C 13/02 (2006.01)
  H01C 1/148 (2006.01)
(52) U.S. Cl.
  CPC ............. G01R 19/32 (2013.01); H01C 1/148 (2013.01); H01C 13/02 (2013.01); H01C 7/06 (2013.01)
(58) Field of Classification Search
  CPC .......................... G01R 19/00; G01R 19/0084; G01R 19/0092; G01R 19/32; H01C 7/00; H01C 7/06; H01C 13/00; H01C 13/02; H01C 1/00; H01C 1/14; H01C 1/148

USPC .... 324/76.11, 126, 127, 500, 512, 522, 600, 324/649, 691, 713; 702/1, 57, 64; 361/600, 601, 605, 611, 622, 624, 627, 361/637, 639, 641, 644, 648, 775
  See application file for complete search history.

(56) References Cited

U.S. PATENT DOCUMENTS

| | | | |
|---|---|---|---|
| 2013/0181807 A1 | 7/2013 | Hetzler | |
| 2014/0320150 A1* | 10/2014 | Sato | G01R 1/203 324/601 |
| 2015/0115935 A1* | 4/2015 | Komai | G01R 1/203 324/126 |
| 2016/0230800 A1* | 8/2016 | Sawai | H01R 4/34 |
| 2016/0231359 A1* | 8/2016 | Nakamura | G01R 1/203 |
| 2018/0100877 A1* | 4/2018 | Nakamura | H01C 3/00 |

FOREIGN PATENT DOCUMENTS

| | | |
|---|---|---|
| JP | 2012-34469 A | 2/2012 |
| WO | 2011-068205 A1 | 6/2011 |
| WO | 2012/019784 A1 | 2/2012 |
| WO | 2015/060102 A1 | 4/2015 |

* cited by examiner

[FIG. 1]
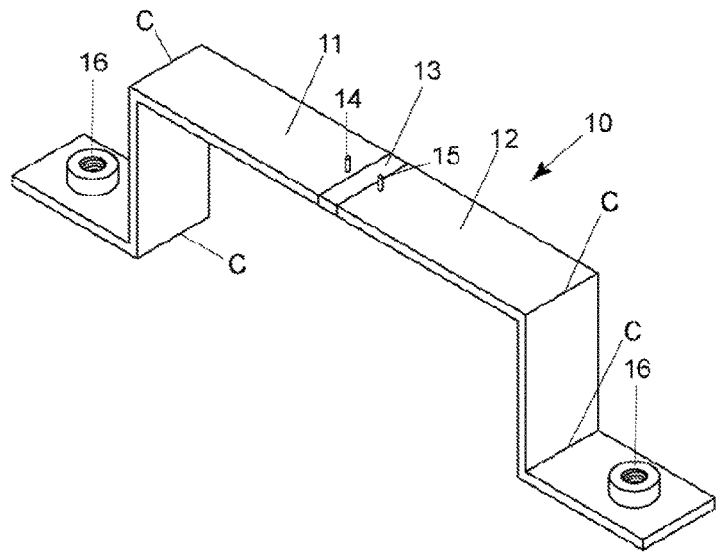
[FIG. 2]
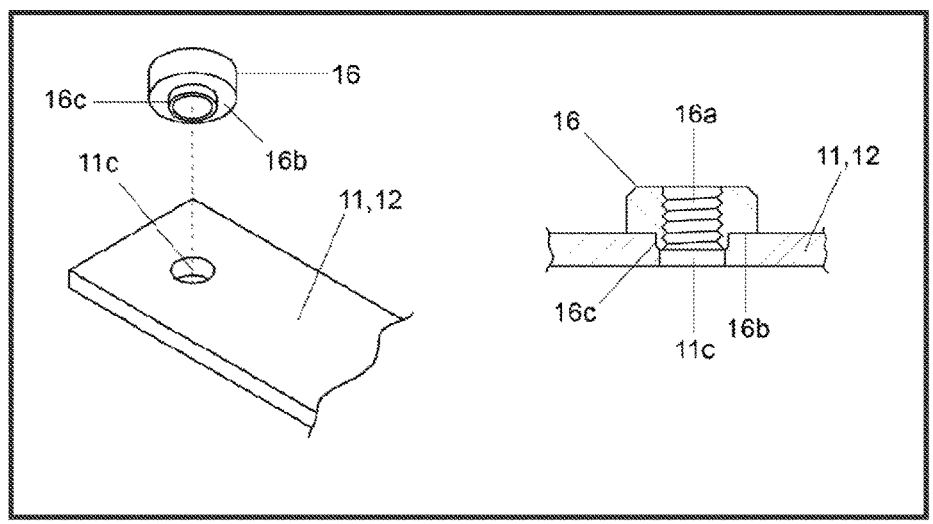

[FIG. 3]
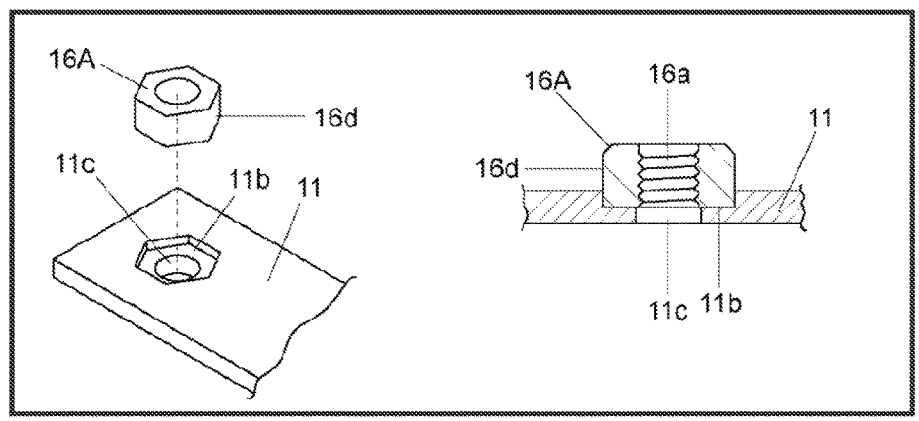
[FIG. 4]
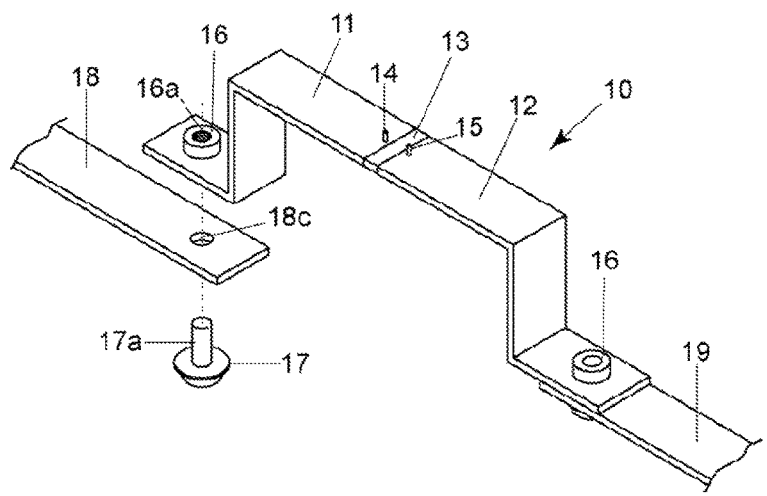

[FIG. 5A]
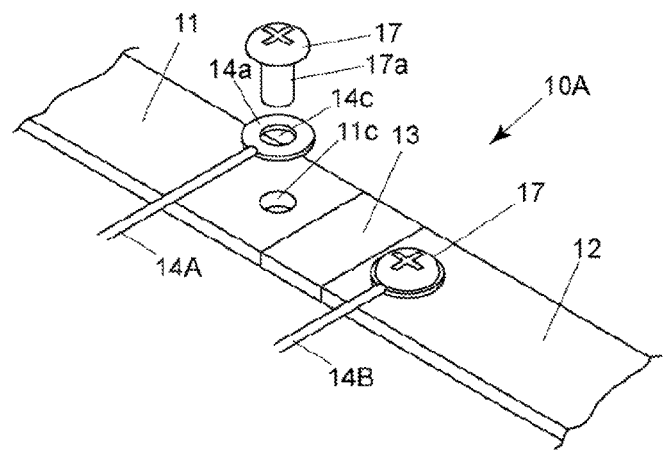
[FIG. 5B]
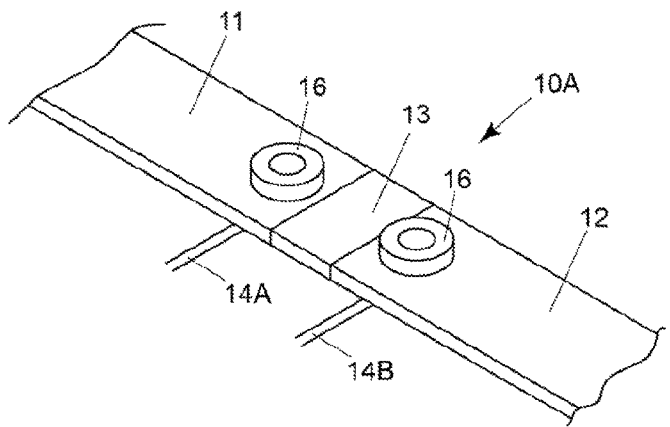

[FIG. 6A]
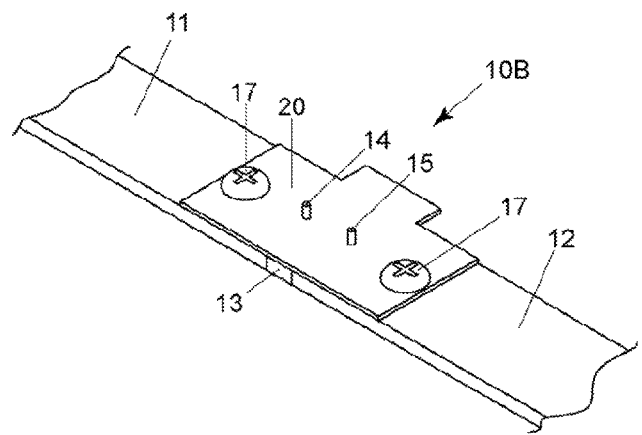
[FIG. 6B]
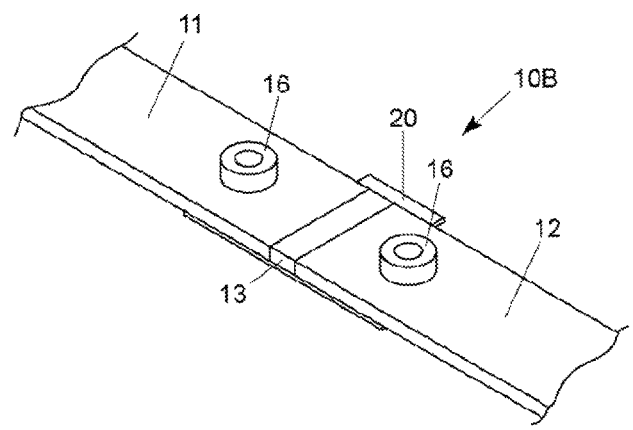

[FIG. 7]
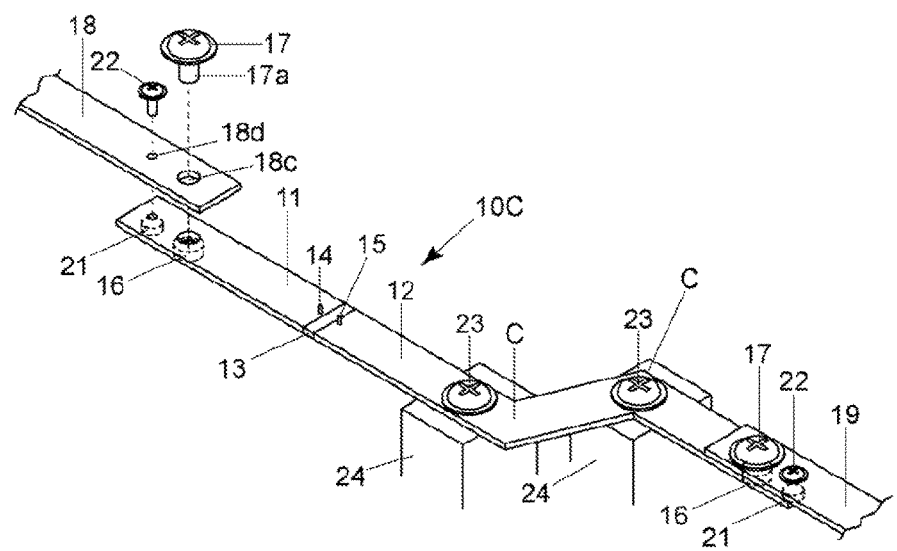
[FIG. 8]
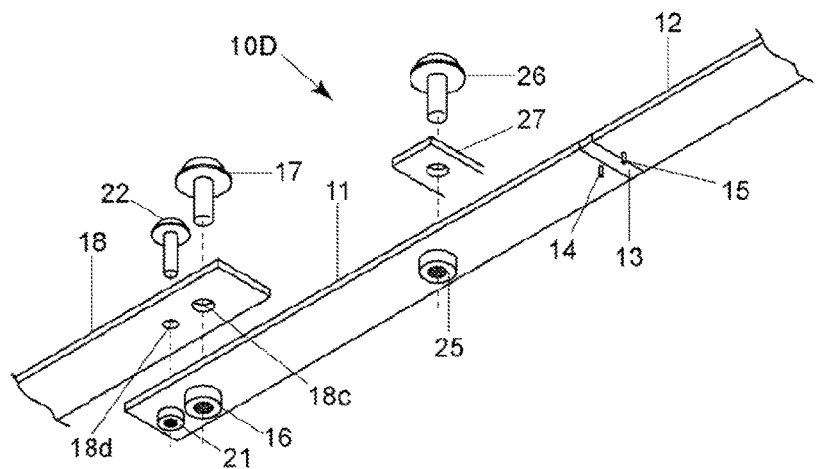

[FIG. 9A]
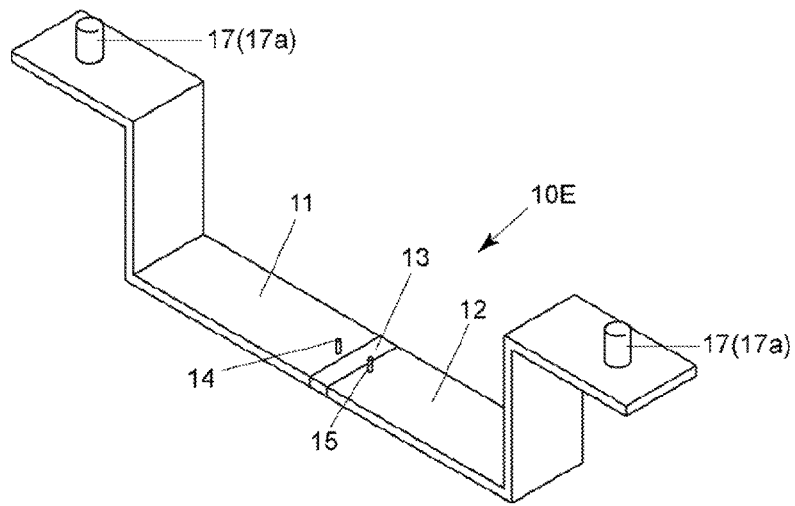
[FIG. 9B]
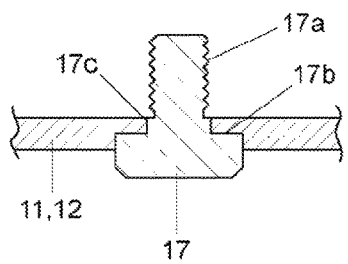

[FIG. 10]
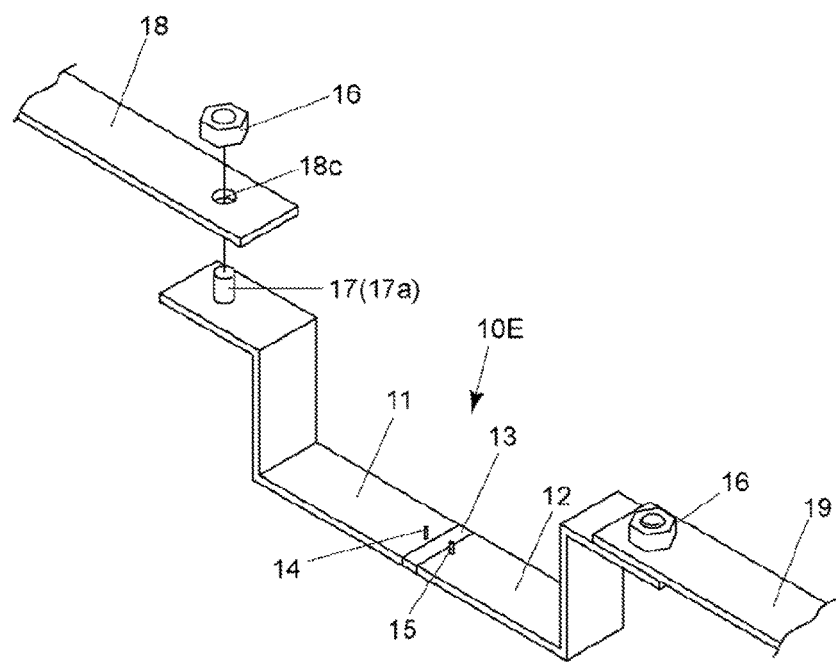

CURRENT DETECTION DEVICE

TECHNICAL FIELD

The present invention relates to a current detection device, which is able to measure a current with high accuracy, while using the current detection device as a current wiring.

BACKGROUND ART

The current is detected by using a shunt resistor, which measures a voltage caused by the current flowing through the shunt resistor in various kinds of current detections. The detection includes, an electrical charge and discharge current in a battery, a motor current that drives an electric vehicle or a hybrid-power car etc., a current in electric equipment such as air conditioner, and a current in power generation machines including solar battery etc.

Conventionally, a shunt resistor and a bus bar is connected by forming holes in an electrode portion of the shunt resistor and a portion of the bus bar, and fixing the shunt resistor and the bus bar by inserting a bolt through the holes of the shunt resistor and the bus bar and screw fastening the bolt to a nut. Also, making an electrode portion of a shunt resistor to be a bolt-like portion, inserting the bolt-like portion into a hole in a bus bar, and screw fastening a nut onto the bolt like portion of the shunt resistor is known (for example, Japanese re-open intentional patent publication WO2011-68205).

However, according to such connections between the busbar and the shunt resistor, because of increase of connections, a heat generation occurs by contact resistance at the connection between the busbar and the shunt resistor, and a problem of securing connection reliability occurs. Then, a current detection device that can be used for detecting a large current with high reliability is required. Japanese laid open patent publication 2008-039571 discloses a bus bar type shunt resistor, which includes a first wiring member, a second wiring member, and a resistor body welded and fixed between the first and the second wiring members, and which is formed like a bus bar (see FIG. 6 etc.).

SUMMARY OF INVENTION

Technical Problem

However, the bus bar type shunt resistor is generally connected to another bus bar etc. by means of rotational fastening of screw members such as a bolt and a nut etc. In the case, the bolt or the nut to be rotationally fastened can move freely, then it may be not easy to rotationally fasten the bolt to the nut. For instance, in a narrow space such as an engine room in a motor vehicle, it may be not easy to rotationally fasten the bolt to the nut while keeping the nut fixed.

The invention has been made basing on above-mentioned circumstances. Thus, an object of the invention is to provide a current detection device, which makes it possible to connect the bus bar type shunt resistor easily to another member such as another bus bar etc. by means of rotationally fastening of screw members.

Solution to Problem

The current detection device of the invention includes a pair of wiring members consisting of conductive metal material, a resistor body consisting of metal material having a smaller temperature coefficient of resistance than the wiring members and the resistor body bonded to the wiring members; and a screw member, which is fixed to at least one of the wiring members and which is a separate member from the wiring members.

That is, the current detection device of the invention is a bus bar type shunt resistor, which includes wiring members and one of screw members (a bolt or a nut) fixed on one surface of the wiring members. Then it makes to sandwich another member disposed on another surface of the wiring members, and to rotationally fasten another one of the screw members easily to the fixed one of the screw members.

Then, fixation of one of the screw members becomes unnecessary, and it makes easy to fix another member on another surface of the wiring members only by rotationally fastening another one of the screw members to the fixed one of the screw members. It is especially useful in the cases, where work of rotational fastening can be possible only from one side.

Since, the screw member is a separate member from the wiring members, the screw member having enough strength can be selected. And, manufacturing process of the wiring member itself can be minimum. Since the current detection device is configured as a bus bar, wiring member function as a bus bar and shunt resistor type current detection function are integrated. Then number of parts can be reduced. Connection points can be minimum. And, highly accurate and highly reliable current detection becomes possible.

BRIEF DESCRIPTION OF DRAWINGS

FIG. 1 is a perspective view of the current detection device of embodiment 1.

FIG. 2 Left view of FIG. 2 is an exploded perspective view, and right view of FIG. 2 is a cross sectional view, both illustrate the nut (one of screw members) and its mounting structure.

FIG. 3 Left view of FIG. 3 is an exploded perspective view, and right view of FIG. 3 is a cross sectional view, both illustrate a variation of the nut (one of screw members) and its mounting structure.

FIG. 4 is an exploded perspective view of the current detection device of embodiment 1, where another bus bar connects to the current detection device.

FIG. 5A is an exploded perspective upper view of the current detection device of embodiment 2.

FIG. 5B is an exploded perspective bottom view of the current detection device of embodiment 2.

FIG. 6A is an exploded perspective upper view of the current detection device of embodiment 3.

FIG. 6B is an exploded perspective bottom view of the current detection device of embodiment 3.

FIG. 7 is an exploded perspective view of the current detection device of embodiment 4, where another bus bar connects to the current detection device.

FIG. 8 is an exploded perspective view of the current detection device of embodiment 5, where another bus bar connects to the current detection device.

FIG. 9A is a perspective view of the current detection device of embodiment 6.

FIG. 9B is a cross sectional view of the nut (one of screw members) of FIG. 9A and its mounting structure.

FIG. 10 is an exploded perspective view of the current detection device of embodiment 6, where another bus bar connects to the current detection device.

DESCRIPTION OF EMBODIMENTS

Embodiments of the present invention will be described below with referring to FIG. 1 through FIG. 10. Like or corresponding parts or elements will be denoted and explained by same reference characters throughout views.

FIG. 1 illustrates a current detection device 10 of embodiment 1. The device 10 includes long size first wiring member 11 and second wiring member 12 consisting of conductive metal material such as Cu, Cu system alloy, or A etc., and a resistor body 13 consisting of metal material having a smaller temperature coefficient of resistance than the wiring members 11,12 and the resistor body bonded to the wiring members 11,12. The long size first wiring member 11 and second wiring member 12 play roll of a bus bar configuring a current path and terminals connecting to the resistor body 13. The wiring members 11,12 may be same length and same shape or different length and different shape.

The resistor body 13 consists of resistor alloy metal material such as Cu—Mn system, Cu—Ni system, or Ni—Cr system etc. having a very smaller temperature coefficient of resistance than Cu etc. Both end faces of the resistor body 13 abut on an end face of wiring member 11 and on an end face of wiring member 12, and they are welded to form bonded faces. As to welding, electron beam welding, laser beam welding, or brazing etc. can be used. An end portion of resistor body and an end portion of wiring member may be overlapped and pressure-welded to form the bonded faces. Then, the current detection device 10 is formed in shape of a bus bar as a whole.

Voltage detection terminals 14,15 are provided on wiring members 11,12 at vicinity of the joint face with the resistor body 13. The current flowing through wiring members 11,12 passes through the resistor body 13 and generates a voltage between both ends of the resistor body. The voltage is detected by the voltage detection terminals 14,15. Then, the current detection device 10 can obtain highly accurate current detection depending on the structure of the resistor body 13 and the circumference thereof.

The wiring members 11,12 carries out a function of electrodes (terminals) of the shunt resistor while carrying out a function of a bus bar, then, the bus bar function and the shunt resistor function are integrated. Then, a connection, which connects a shunt resistor and a bus bar, where a large current flows, becomes unnecessary, and number of parts can be decreased. And, it becomes possible to detect a current flowing through a bus bar with high accuracy and high reliability by the shunt resistor function in the bus bar. The pair of wiring members 11,12 is provided with bent portions C. Then, freedom of disposing the bus bar can be secured.

A screw member (nut) 16, which is a separate member from the wiring members 11,12, is fixed on at least either one of surfaces of the wiring members 11,12, at both ends thereof. The wiring members 11,12 are disposed at both sides of the resistor body 13. The nut 16 is provided with a female screw portion 16a, and a projection portion 16c of the nut 16 is pressure-fitted and fixed into a hole 11c (see FIG. 2). Diameter of hole 11c in wiring member 11 is a little smaller than diameter of projection portion 16c of the nut 16.

Then, since wiring member 11 is provided with a hole 11c, a flat part 16b of nut 16 abuts on a surface of wiring member 11 around the hole 11c. And, outer circumference surface of projection portion 16c of nut 16 abuts on inner circumference surface of hole 11c. These surfaces may be fixed by welding etc. Generally, Cu is used for material of the wiring members 11,12, and the flat part 16b of nut 16 abuts on a surface of wiring members 11,12. Then, even if rotationally fastening of screw members somewhat strongly, the surface of wiring members 11,12 is never damaged.

FIG. 3 illustrate a variation of a screw member (nut) 16. Outer peripheral surfaces of the nut 16A is formed by faces 16d of the hexagon. Then, the wiring member 11 is provided with a shallow hexagonal steps 11b and a hole 11c formed at the center of the steps 11b. The nut 16A is provided with a female screw part 16a, and outer peripheral faces 16d of the hexagon is fitted and fixed into the shallow hexagonal steps 11b. Therefore, a bottom surface of the nut 16A abuts on shallow steps 11b around the hole 11c, and outer peripheral faces 16d of the hexagon of the nut 16A abuts on inner peripheral faces of shallow steps 11b. These abutted faces may be fixed by welding.

FIG. 4 illustrates an example for connecting an end of the current detection device of embodiment 1 to another bus bar. A hole (not shown) formed at the end of wiring member 11 and a hole 18c formed at the end of another wiring member 18 are positioned, a bolt 17 is inserted into both of these holes, and male screw part 17a of the bolt 17 is rotationally fastened (screw fastened) to female screw part 16a of the nut 16.

That is, fixing one of screw members (nut) 16 on one surface of the wiring members 11,12, sandwiching another wiring members 17,18 disposed on another surface of the wiring members 11,12, and rotationally fasten another one of screw members (bolt) 17 to the fixed one of screw members (nut) 16. Since, the nut 16 is a separate member from wiring members 11,12, and fixed on wiring members 11,12 beforehand, then the nut 16 is not necessary to be fixed, and wiring members 18,19 can be connected to wiring members 11,12 only by rotationally fastening the bolt 17 to the fixed nut 16.

Therefore, it becomes easy to connect an end of a bus bar to another bus bar etc. That is, when rotationally fastening a bolt to a nut, it is general to rotationally fasten the bolt to the nut while keeping the nut not to move. As to the current detection device 10, connecting wiring members 11,12 to wiring members 18,19 can be possible only by sandwiching another wiring member 18,19 and rotationally fastening the bolt 17 to the fixed nut 16. It is especially useful in the case where rotational fastening can be done from only one side. For example, in a narrow space such as an engine room in motor vehicles etc.

Since, the screw member is a separate member from the wiring members, a screw member having enough strength can be selected. And, manufacturing process of the wiring member itself can be minimum. Since the current detection device is configured as a bus bar, wiring member function as a bus bar and shunt resistor function are integrated. Then number of parts can be reduced. Connection points can be minimum. And, highly accurate and highly reliable current detection becomes possible.

FIGS. 5A-5B illustrate a current detection device 10A of embodiment 2. Voltage detection terminals 14A,14B are connected to wiring members 11,12 by means of screw fastening the bolt 17, which is separate member from wiring members, to the fixed nut 16, which is separate member from wiring members, on the wiring members 11,12. Here, the nut 16 is positioned to the hole 11c in the wiring member 11 and fixed thereto by welding etc.

Voltage detection terminals 14A,14B are provided with a flat connection part 14a, and the flat connection part 14a is provided with a hole 14c. The hole 14c of voltage detection terminal is positioned to hole 11c of the wiring member, male part of the bolt 17 is inserted into the holes 14c,11c, and female part 16a of the nut 16 is rotationally fastened (screw fastened) to the bolt 17. Then, fixation work for the nut 16 is not necessary, and voltage detection terminals 14A,14B can connect to the wiring members 11,12 only by screw fastening the bolt 17 to the fixed nut 16. Especially, it is useful in case that rotationally fastening work can be possible only from bolt side.

FIGS. 6A-6B illustrate a current detection device 10B of embodiment 3. A circuit board 20 is fixed to connect to voltage detection terminals 14,15 formed on the wiring members 11,12. In the embodiment, the wiring members 11,12 is provided with a hole, and a screwing member (nut) is positioned to the hole, and fixed on lower surface of the wiring members 11,12.

A circuit board 20, which has holes (not shown), is disposed on upper surface of the wiring members 11,12. A bolt 17 is inserted into the holes of the circuit board and the wiring member, and rotationally fastened to the fixed nut 16. Circuit patterns are formed on the circuit board 20, and amplifier circuits, a micro-computer, and signal output terminals are mounted on the circuit board 20 (not shown). Then, detected voltage signals, which are picked up from wiring patterns connected to voltage detection terminals 14,15, are amplified and sent to a voltage detection device (not shown).

Upon the current detection device 10B, fixation work for the nut 16 is not necessary, and a circuit board 20, which connects to voltage detection terminals 14,15, can be fixed to the wiring members 11,12 only by screw fastening the bolt 17 to the fixed nut 16.

FIG. 7 illustrates a current detection device 10C of embodiment 4, which connects to another bus bar 18,19. Upon the embodiment, a nut 16 is fixed on one surface (another surface, where voltage detection terminals 14,15 are formed) of wiring members 11,12. Another bus bars 18,19 are disposed on another surface of wiring members 11,12, and sandwiched. A bolt 17 is inserted into hole 18c of wiring member 18 and a hole of wiring member 11, and rotationally fastened to the fixed nut 16 so as to connect wiring members 11,12 to another bus bars 18,19 as well as above mentioned embodiments.

However, when a bus bar configured as a current detection device is connected to another bus bar etc., there is a problem that a rotational force is applied to the joint surface between the wiring member and the resistor body by rotational fastening (screw fastening) of screw members, and then current detection error may happen.

Also, a bus bar configured as a shunt resistor is generally long size, then there is a problem to generate a vibration in the current detection device. For example, when a vibration is caused in the bus bar by an engine or others, since the resistor body is bonded to the wiring members, the vibration is transmitted to the joint surface, and the vibration may influence the joint surface. Thus, there is a possibility that detection error be caused by the vibration in the current detection device.

Then, in the embodiment 4, a positioning portion 21,22 is provided, which includes a nut 21 fixed on one surface of the wiring members 11,12, and a bolt 22 inserting into a hole of wiring members 18,19 and a hole of wiring members 11,12, sandwiching wiring members 18,19 and wiring members 11,12, and rotationally fastening the bolt 22 to the fixed nut 21.

In forming a positioning portion by screw fastening the bolt 22 to the fixed nut 21 previously, when rotationally fastening the bolt 17 to the fixed nut 16 for connecting another bus bar 18,19 to the current detection device 10C, relative rotation of wiring members 11,12 to another wiring members 18,19 can be stopped, and wiring members 11,12 and another wiring members 18,19 are exactly positioned to the same direction, and connected and fixed. Then, rotational force by screw fastening can be prevented from applying to the joint surface between the resistor body 13 and the wiring members 11,12. And, deterioration of current detection accuracy can be prevented.

Further, in the embodiment 4, the wiring member 12 is fixed to a fixation portion 24 by means of the bolt 23. The wiring members 11,12 are like a bus bar, and long size. Then, when the current detection device 10C is mounted in a engine room in a vehicle, for example, vibration might be caused in the current detection device 10C like a bus bar depending on vibration of the engine. Therefore, the vibration is applied to the joint surface between the resistor body 13 and the wiring members 11,12, and it may become to deteriorate the current detection accuracy. Thus, by providing a fixation portion 24 at intermediate of the wiring members 11,12, the vibration can be prevented from being applied to the joint surface between the resistor body 13 and the wiring members 11,12, and deterioration of current detection accuracy can be prevented.

FIG. 8 illustrates a current detection device 10D of embodiment 5. The embodiment 5 is a variation of the fixation portion for preventing the vibration. That is, by a bolt 26 rotationally fastened to the fixed nut 25 on one surface of the wiring member 11, while sandwiching the wiring member 11 and the fixed plate member 27, an intermediate of the wiring member 11 is fixed to the fixed plate member 27.

In the embodiment 5, the vibration occurred in the current detection device 10D like a bus bar can be suppressed, and high accuracy current detection becomes possible. One of screw members 16,21 is fixed on one surface of the wiring member 11, another wiring member 18 is disposed on another surface of the wiring member 11, and another one of screw members 17,22 is rotationally fastened to the fixed one of screw members 16,21 while sandwiching the wiring member 11 and another wiring member 18, as well as above mentioned embodiments.

FIGS. 9A-9B illustrate a current detection device 10E of embodiment 6. FIG. 10 illustrates that an end of the current detection device 10E is connected to another bus bar 18,19 by means of screw members 16,17. In the previously mentioned all of embodiments, the nut 16 is fixed on one surface of the wiring members beforehand. However, as shown in embodiment 6, the bolt 17 may be fixed on one surface of the wiring members 11,12 beforehand. And, disposing another bus bar 18,19 and rotationally fastening (screwing) the nut 16 to the fixed bolt 17 while sandwiching the wiring members 11,12 and another wiring members 18,19.

As shown in FIG. 9B, the bolt 17 is provided with a male screw part 17a, and a female screw part 16a (not shown) of the nut 16 is rotationally fastened to the male screw part 17a of the bolt 17. The bolt 17 is provided with a projection part 17c, which is fitted into a hole formed in the wiring members 11,12, and outer circumference surface of the bolt 17 abuts on inner circumference surface of the hole formed in the wiring members 11,12. Flat part 17b of the bolt 17 abuts on a flat surface around the hole formed in wiring members 11,12. These abutted surfaces may be fixed by welding.

Then, as to the current detection device 10E of the embodiment 6, one of screw members (bolt) is fixed on one surface of the wiring members 11,12, another wiring members 18,19 are disposed on another surface of the wiring members 11,12, and another one of screw members (nut) is rotationally fastened to the fixed one of screw members (bolt) while sandwiching the wiring members 11,12 and another wiring members 18,19. Therefore, connection work for connecting an end of the bus bar (wiring members 11,12) to an end of another bus bar (wiring members 18,19) becomes easy, as well as before mentioned embodiments.

Although embodiments of the invention have been explained, however the invention is not limited to above embodiments, and various changes and modifications may be made within scope of the technical concept of the invention.

INDUSTRIAL APPLICABILITY

The invention can be suitably applicable for current detection devices in shape of a bus bar.

The invention claimed is:

1. A current detection device comprising:
   a pair of wiring members consisting of conductive metal material;
   a resistor body consisting of metal material having a smaller temperature coefficient of resistance than the wiring members and the resistor body bonded to the wiring members; and
   a screw member, which is fixed to at least one of the wiring members and which is a separate member from the wiring members, the screw member being a nut, which is provided with a female screw portion, a projection portion and a flat part;
   wherein the wiring member is provided with a hole, by pressing the projection portion into the hole shallowly, the flat part of the screwing member abuts on the surface of the wiring member around the hole and the projection portion of the screwing member is in contact with the inner circumferential surface of the hole.

2. The current detection device of claim 1, wherein the current detection device is formed in a bus bar shape as a whole.

3. The current detection device of claim 1, wherein the screw member includes a male screw part or a female screw part.

4. The current detection device of claim 1, wherein the wiring member is provided with a hole and the screw member is abutted on a surface of the wiring member around the hole.

5. The current detection device of claim 1, wherein the wiring member is provided with a hole and a part of the screw member is abutted on inner surface of the hole.

6. The current detection device of claim 1, wherein the pair of the wiring members is provided with a bent portion at either one of the wiring members or both of the wiring members.

7. A method for fixing a current detection device to another member, comprising:
   fixing one screw member on one surface of a wiring member, which is one of wiring members of a current detection device that includes a pair of wiring members consisting of conductive metal material and a resistor body consisting of metal material having a smaller temperature coefficient of resistance than the wiring members and the resistor body bonded to the wiring members; and
   disposing another member on another surface of the wiring member and rotationally fastening another screw member to the one screw member fixed on the one surface of the wiring member,
   wherein the one screw member is a nut, which is provided with a female screw portion, a projection portion and a flat part;
   wherein the wiring member is provided with a hole, by pressing the projection portion into the hole shallowly, the flat part of the screwing member abuts on the surface of the wiring member around the hole and the projection portion of the screwing member is in contact with the inner circumferential surface of the hole.

\* \* \* \* \*